United States Patent [19]

Henkels

[11] 4,130,893
[45] Dec. 19, 1978

[54] JOSEPHSON MEMORY CELLS HAVING IMPROVED NDRO SENSING

[75] Inventor: Walter H. Henkels, Putnam Valley, N.Y.

[73] Assignee: International Business Machines Corporation, Armonk, N.Y.

[21] Appl. No.: 782,573

[22] Filed: Mar. 29, 1977

[51] Int. Cl.² ............................................. G11C 11/44
[52] U.S. Cl. ...................................... 365/162; 307/212
[58] Field of Search .................. 340/173.1; 307/277, 307/245, 306, 212; 338/325; 364/200 MS File, 900 MS File; 357/5

[56] References Cited

U.S. PATENT DOCUMENTS

| | | | |
|---|---|---|---|
| 3,402,400 | 9/1968 | Sass | 340/173.1 |
| 3,491,345 | 1/1970 | Gange | 340/173.1 |
| 3,987,309 | 10/1976 | Hamel et al. | 307/277 |

OTHER PUBLICATIONS

Sanborn, "Persistent Current Storage Cell", IBM Technical Disclosure Bulletin, vol. 3, No. 11, Apr. 1961, pp. 50-51.
Anacker, "Memory Cell Using a Single Josephson Tunneling Gate", IBM Technical Disclosure Bulletin, vol. 15, No. 2, Jul. 1972, pp. 449-451.

Primary Examiner—Bernard Konick
Assistant Examiner—Donald McElheny
Attorney, Agent, or Firm—Thomas J. Kilgannon, Jr.

[57] ABSTRACT

A superconducting memory cell which includes a single Josephson junction or write gate disposed in a superconducting loop having improved sense margins is disclosed. The improved sense margins are achieved by fabricating the superconducting loop so that first and second branches thereof have different inductances. In a specific example, a first branch containing the single Josephson junction has the higher inductance. Still more specifically, the inductance of the first branch containing the Josephson junction or write gate is twice as great as the inductance of the other branch when the $I_{min}$ of the write gate is zero. In addition, another Josephson junction or sense gate must be disposed in electromagnetically coupled relationship with the second branch of the loop, and binary information must be stored in the form of clockwise and counterclockwise circulating currents of equal magnitude. Writing and reading are accomplished by coincident currents being applied to the cell. A cell having a single control current in addition to a gate current for coincident current selection of a desired cell is shown. A similar cell having at least another control current in addition to the previously mentioned control current and a gate current for coincident current selection is also disclosed. The latter cell, embodied in array form, has a plurality of horizontally disposed control lines each of which intersects a row of memory cells. In addition, a diagonally disposed control line intersects the write gates of adjacent cells which are disposed in diagonally spaced relationship with each other. Arrays which include diagonal control lines have improved write margins and, if they conform to the criteria outlined above, they also have improved sense margins.

20 Claims, 8 Drawing Figures

JOSEPHSON MEMORY CELLS HAVING IMPROVED NDRO SENSING

BACKGROUND OF THE INVENTION

1. Field of the Invention

This invention relates generally to superconducting memory cells which store information in the form of persistent circulating currents. More specifically, it relates to superconducting memory cells wherein stored binary information can be read out nondestructively (NDRO). Still more specifically, it relates to superconducting NDRO memory cells which incorporate only a single write gate in one of the pair of branches which forms a superconducting loop in such memory cells. Each of the pair of branches of the superconducting memory cell has a different value of inductance. The branch containing the single write gate may have the higher inductance and, to obtain the best sensing in such cells when the write gate $I_{min} = 0$, it must be twice as great as the inductance of the other branch. In general the specific choice of the ratio of branch inductances is dependent upon $I_{min}$. The write gate is a device capable of carrying Josephson current and may be a single or multijunction device which is capable of being switched by an associated control line. The multijunction devices are well-known to those skilled in the superconducting art as interferometers. To achieve the improved sensing of the present application, a sense gate in the form of another Josephson junction must be disposed in electromagnetically coupled relationship with the branch of the memory cell loop which does not contain the write gate. Finally, binary information must be stored in the resulting memory cell configuration in the form of clockwise and counterclockwise circulating currents of equal magnitude. Memory cells of the character just described retain information stored therein as long as the storage loops remain superconducting and have improved sensing margins over known NDRO memory cells. The criteria just outlined can be applied to all memory cells which store information in the form of counterrotating circulating currents and have application in regimes where coincident current writing or storage is carried out using single or multicontrol lines. Of course, such arrangements also utilize coincident current sensing. Memory cells of the character described can have a maximum Sense Discrimination Factor, F, of 3 irrespective of the magnitude of $I_{min}$. By applying the teaching of the present application improvements in Sense Discrimination Factor, F, in the range of F's in excess of 2 to 3 can be achieved.

2. Description of the Prior Art

Memory cells using a single Josephson tunneling gate with counterrotating circulating currents to define two binary states and a sense gate associated with a branch of the memory cell loop not containing the write gate are well-known in the prior art. In the usual case, the inductances of the two branches of the loop are equal and, as a result, such cells cannot achieve the improved sense margins of the memory cell of the present application. Typical examples of such arrangements are shown in the following publications:

IBM Technical Disclosure Bulletin, Vol. 15, No. 2, July 1972, pp. 449-451, "Memory Cell Using a Single Josephson Gate" by W. Anacker.

IBM Technical Disclosure Bulletin, Vol. 15, No. 9, February 1973, pp. 2904-05, "NDRO Memory Cell Employing a Single Josephson Tunneling Gate" by W. Henkels.

Neither of the above memory cells can achieve the improved discrimination factor, F, of the present application because both of the cells call for superconducting loop branches of the same inductance.

Other known memories which incorporate circulating currents utilize the presence of only one circulating current to represent one binary condition and the absence of any circulating current to represent another binary condition. At least one is known which appears to have different values of inductance in the loop branches while another has nearly equal inductances in each branch. The following publications show one of each of these types:

IBM Technical Disclosure Bulletin, Vol. 16, No. 1, June 1973, p. 214, "Two Junction Josephson Memory" by P. Wolf. This publication appears to indicate a larger inductance in the branch containing the write gate although nothing is specifically mentioned in the publication with respect to that point. In any event, it does not specifically indicate any relationship between the values of the branch inductances. Beyond this, the cell does not use counterrotating circulating currents to indicate two possible binary states. In addition, the sense gate is associated with the same loop branch as the write gate.

IBM Technical Disclosure Bulletin, Vol. 17, No. 3, August 1974, pp. 890-1, "Nonvolatile, NDRO, Array Logic Memory Cell in Josephson Technology" by K. D. Terlep. Like the previous publication, the memory cell disclosed uses no circulating current to represent one of the binary states and has nearly equal inductances in each of the loop branches.

IBM Technical Disclosure Bulletin, Vol. 18, No. 11, April 1976, pp. 3852-53, "Josephson Feedback Memory Cells" by W. H. Henkels. This publication shows a Josephson memory cell with a single write gate and a sense gate disposed adjacent in a branch which does not contain the write gate. The inductances of the branches are equal and counterrotating circulating currents are utilized to represent the two binary conditions. The publication indicates that for a single-write-gate cell, the writing margins are independent of the ratio of inductances of the two branches. Other comments are made with respect to an ideal single cell to the effect that write margins can be increased by decreasing the value of K which in turn is a function of the inductances of the branches of the cell loop. It is further indicated that read margins have more complex dependencies. Finally, in the publication, it is indicated in the summary at the end of the article that "Cell asymmetry (K not equal to ½) may be used to advantage to increase margins, enabling the use of negligible self-field gates (low gain)." These general statements merely indicate that the inductances of the cell could be asymmetric but do not indicate any relationship between the write and sense gates nor do they suggest which value of inductance should be associated with the write gate to achieve either an improved or maximum discrimination factor.

Proceedings of the IEEE, April 1967, p. 592-3, "A Continuous Film Memory Driven by Multiple Coincident Pulses" by K. Goser et al. The memory array discussed in the article uses a triple coincident pulse memory cell. A separate decoder is utilized for x, y, and z drive lines. The article indicates that the approach utilized offers a considerable increase of the write operating range.

The foregoing prior art shows a number of single write gate NDRO memory cells and a memory array which utilizes a diagonal line driver in addition to the usual x and y drivers of memory arrays. The development of the single write gate memory cells shown appears to have focused on achieving good write margins with little attention being paid to the achievement of improved sense margins. Indeed, the best Sense Discrimination Factor, F, which can be achieved by the prior art is 2. Considering that many of the separate factors involved in achieving the present improved sense margins have been used in memory cell design for many years, it is submitted that the teaching of the present application is distinguishable and unobvious over all the references cited inasmuch as only one combination of a plurality of interacting factors can be utilized to achieve improved sense margins without affecting the write margins. It is clear from a consideration of the prior art that the knowledge of the separate factors involved was insufficient to lead to the improvement obtained using the teaching of the present application.

SUMMARY OF THE INVENTION

In accordance with the broadest aspect of the present invention, a memory cell for storing binary information is provided which includes a superconductive loop adapted for storing binary information in the form of equal magnitude clockwise and counterclockwise circulating currents in the loop. The loop contains first and second branches; one of which has a higher value of inductance than the second. Also included is a first switchable device capable of carrying Josephson current having a given $I_{min}$ disposed in the first branch and a second switchable device capable of carrying Josephson current disposed in electromagnetically coupled relationship with the second branch.

In accordance with the broader aspects of the present invention, a memory cell is provided which further includes means connected to the cell for applying coincident currents to the first device to write binary information into the cell.

In accordance with the broader aspects of the present invention a memory cell is provided which further includes means connected to the cell for applying coincident currents to the cell to sense binary information stored therein.

In accordance with the broader aspects of the present invention, a memory cell is provided wherein the value of inductance of the first branch is two times the value of inductance of the second branch and said given $I_{min}$ is zero providing a Sense Discrimination Factor, F=3.

In accordance with more specific aspects of the present invention, a memory cell is provided wherein means for applying coincident currents includes a current source connected to the memory cell; at least a source of current and at least a control line connected to the control current source disposed in electromagnetically coupled relationship with the first switchable device.

In accordance with still more specific aspects of the present invention, a memory cell is provided wherein the means for applying coincident currents includes a current source connected to the memory cell and a sense current source connected to the second switchable device.

In accordance with still more specific aspects of the present invention, a memory cell is provided wherein the first switchable device has an $I_{min} \neq 0$ providing a Sense Discrimination Factor, F=3.

It is, therefore, an object of this invention to provide a memory cell which has improved sense margins.

Another object is to provide a memory cell with enhanced sense margins which utilizes a single write gate and counterrotating circulating currents to represent two binary conditions.

Still another object is to provide a memory cell which utilizes a diagonally disposed control line to provide a memory cell having improved write and read margins.

Still another object is to provide a single write gate memory cell which has the highest sense discrimination factor yet achieved in Josephson technology.

Yet another object is to provide a single write gate memory cell which is capable of achieving improved sense discrimination factors in a range of factors in excess of 2 to 3.

The foregoing and other objects, features and advantages of the present invention will become apparent from the following more particular description of the preferred embodiment of the invention as illustrated in the accompanying drawings.

BRIEF DESCRIPTION OF THE DRAWINGS

FIG. 1 shows a generalized form of single write gate memory cells and further shows the currents that are applied to both selected and unselected cells.

DESCRIPTION OF PREFERRED EMBODIMENTS

Figure 1:
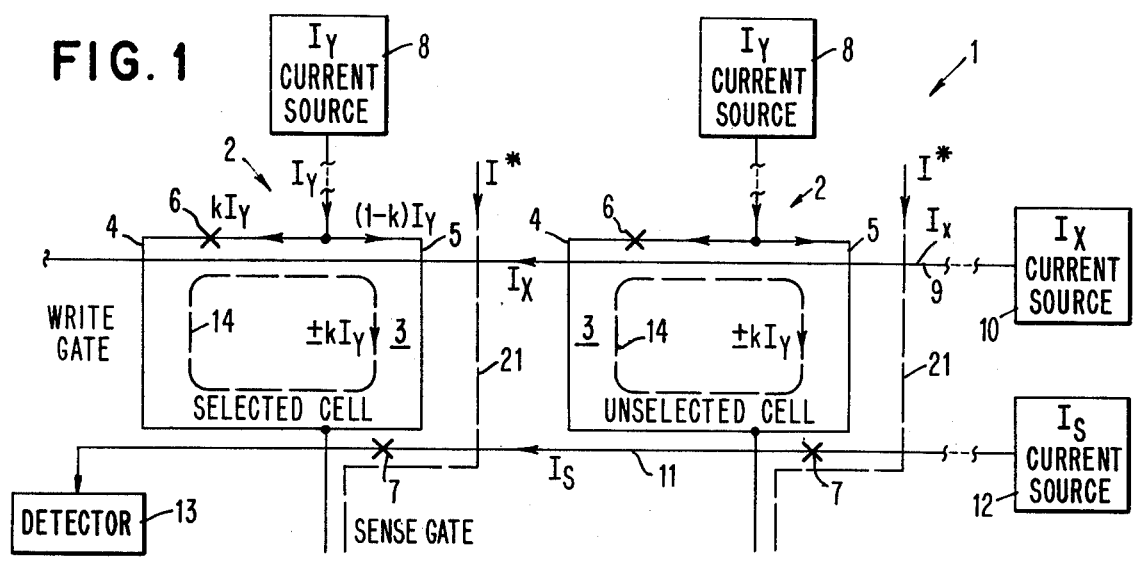
FIG. 1 is a schematic drawing of a portion of an array of memory cells which utilize equal counterrotating circulating currents in a superconductive loop to represent a binary "1" and "0". Each superconducting loop has a pair of branches which have given values of inductance. In addition, a write gate consisting of a Josephson junction is disposed in one of the branches while a sense gate is disposed in electromagnetically coupled relationship with the other branch of the superconductive loop. Current sources for applying coincident currents to both the write and sense gates are also shown. An additional control line associated with the sense gate is shown in dashed line form, indicating that an additional control current may be applied to an associated sense gate.

Referring now to FIG. 1, there is shown therein a portion of an array 1 of memory cells 2 which utilize equal counterrotating circulating currents, $\pm k\, I_y$ in a superconductive loop 3 to represent a binary "1" and "0". Superconducting loop 3 has a pair of branches 4,5 each of which has a given value of inductance. A write gate in the form of an actuable device capable of carrying Josephson current is shown disposed in branch 4 of each of the memory cells 2. A sense gate 7 in the form of an actuable device capable of carrying Josephson current is shown disposed in electromagnetically coupled relationship with branch 5 of each of superconductive loops 3. Memory cells 2 require a pair of coincident currents for both writing and sensing. A bipolar current source 8 otherwise referred to in FIG. 1 as $I_y$ Current Source supplies current $I_y$ to columns of memory cells 2 which are connected in series within a given column. Current $I_y$ from current source 8 splits into branches 4,5 as currents $kI_y$, $(1-k)I_y$, respectively, as shown in the left-most cell 2 of FIG. 1. A control line 9 which is disposed in electromagnetically coupled relationship with each of the write gates 6 enables all of the write gates 6 of a given row by supplying current $I_x$ from a source 10 otherwise identified as $I_x$ Current Source in FIG. 1. A sense line 11 connects sense gates 7 of a row of memory cells 2 and sense current $I_s$ is supplied to each of gates 7 from a source 12 otherwise identified in FIG. 1 as $I_s$ Current Source. Sense line 11 is connected to a detector or sense amplifier 13 to detect the binary state of a selected cell 2.

Assuming for purposes of illustration that it is desired to write information into the left-most cell (Selected Cell) 2 of FIG. 1, current pulses $I_y$ and $I_x$ are coincidentally applied from sources 8, 10, respectively. Current $I_x$ in control line 9 causes write gate 6 to switch from the zero voltage state to the voltage state in a well-known manner diverting all current from branch 4 of loop 3 into branch 5. Once the current pulses from sources 8, 10 cease, a circulating current $+kI_y$ shown by dashed line 14 in the Selected Cell is set up in a well-known manner in superconducting loop 3. The clockwise circulating current shown by dashed line 14 in the Selected Cell is representative of one of two possible binary conditions. A counterclockwise current can be set up in the Selected Cell to represent the other of the two possible binary conditions by applying a current pulse $I_y$ from source 8 of polarity opposite to that originally applied hereinabove. The left-most cell 2 of FIG. 1 can, therefore, be written by coincident current selection and a binary "1" or "0" can be represented by clockwise and counterclockwise circulating currents in superconductive loop 3. As long as memory array 1 is maintained at liquid helium temperatures, a circulating current once set up will remain without the application of any power until it is affirmatively changed.

To sense the condition of the left-most memory cell 2 of FIG. 1 otherwise identified therein as Selected Cell, a current $I_s$ from current source 12 is applied via sense line 11 to all sense gates 7 in a given row. The current applied is insufficient to switch gate 7 by itself and, to the extent that a circulating current is present in any memory cell 2 which is in the same direction as current $I_s$, both of these currents are insufficient to switch sense gate 7. At this point, then, none of the cells has been selected and none of the sense gates 7 can switch to its voltage state. Coincident current reading or sensing of the selected cell is achieved by actuating source 8 to apply a current pulse of always the same polarity and of such magnitude that the sense gate 7 associated with selected cell 2 switches to the voltage state. The switching of a sense gate 7 to the voltage state causes a drop in current which is detected by detector or sense amplifier 13. Using this approach, information stored in the selected memory cell 2 is sensed without destroying the stored information. Such cells are characterized as NDRO (Nondestructive Read-Out) cells.

Without further characterizing any of the parameters involved, the above description of the array of FIG. 1 could be said to utilize a conventional approach to NDRO sensing in Josephson memories. However, by incorporating the teaching of the present application into the arrangement of FIG. 1, improved sense margins over those obtainable in conventional NDRO arrays can be achieved. With respect to conventional NDRO sensing, three fundamental aspects determine the operating margins. They are 1) fabrication variations across the array which lead to a corresponding variation of sense gate switching threshold curves, 2) the ratio of cell circulating current to $I_{co}$ where $I_{co}$ is that value of sense gate control current corresponding to one quantum of flux in the sense gate, and 3) the ratio of control level seen by a selected gate to the control level seen by an unselected gate. The latter aspect basically determines the degree to which a desired sense gate is discriminated from all of the other unselected or undesired sense gates of a bit organized memory array. Defining the ratio in aspect 3) above as the Sense Discrimination Factor, $$F = \frac{\text{Selected gate control level}}{\text{Maximum unselected gate control level}}$$

a maximum value of F which implies a maximization of sense margins in NDRO memory arrays can be achieved if, in addition to the factors already described in connection with FIG. 1, the inductances of branches 4, 5 of FIG. 1 are in general asymmetrical. Thus, the inductance of branch 4 may be greater than the inductance of branch 5. In one such instance, to achieve a maximum value of $F = 3$, the inductance of branch 4 should be twice as large as the inductance of branch 5 in FIG. 1 where the $I_{min}$ of write gate 6 is zero.

Summarizing now all the factors involved to produce a maximum value of F, the embodiment of FIG. 1 must include the following parameters:

(A) Sense gate 7 must be placed under branch 5 of superconducting loop 3. There must be no write gate in branch 5 which controls the associated sense gate 7.

(B) The binary storage mode must consist of "1" and "0" states defined as equal magnitude but opposite sense circulating currents.

(C) The inductances of the write and sense branches, 4, 5, respectively, of superconducting loop 3 must be asymmetrically split, such that $k = [1+2(I_{min}/I_y)] \div 3$ where $I_{min}$ = the minimum non-zero-voltage current of write gate 6 and $I_y$ = the supply current of loop 3. The dimensionless parameter, k, expresses the inductive asymmetry, and is defined as $k = L_s/(L_s+L_w)$ where $L_s$ and $L_w$ are the inductances of the sense and write branches 4, 5, respectively, of superconductive loop 3 in FIG. 1.

Under the above conditions, the Sense Discrimination Factor, F, has a maximum value of 3. At this point, it should be appreciated that the Sense Discrimination Factor, F, is solely a function of the inductive asymmetry of the branches of loop 3 and $I_{min}$ and, to the extent that the prior art lacked this perception, the best Discrimination Factor achieved was F = 2 for the special case where the inductances of both branches were equal. It should be further appreciated that regardless of the value of $I_{min}/I_y$, that is where $I_{min} \neq 0$, it is possible to achieve the maximum value of F = 3 using different values of inductive asymmetry, k. This will become more apparent from a consideration of the following discussion.

In an array of memory cells 2 similar to those shown in FIG. 1, sense lines 11 run along the rows such that all sense gates 7 in the row are subjected to the same sense supply current, $I_s$.

The cell circulating currents are proportional to the cell supply current, $I_y$, which flows in supply lines which intersect each sense line 11 only once. For purposes of exposition, the circulating currents indicated by dashed line 14 in FIG. 1 are denoted herein as $C_1 = aI_y$, the circulating current which corresponds to the "1" state and $C_0 = \alpha aI_y$, the circulating current corresponding to the "0" state.

During the sensing operation, the selected cell sense gate 7 is subjected to a current $cI_y$ in addition to the cell circulating current denoted by dashed line 14 in FIG. 1. Since it is desired to switch the selected sense gate 7 if a "1" is present in the selected cell, the parameters c and a should be additive or have the same sign. Under such circumstances, the Sense Discrimination Factor, F, is maximum with a value F = 3, if and only if the circulating currents which represent the binary states are of equal magnitude but of opposite sense. From this, it should be clear that the value of $\alpha$ in $C_0 = \alpha aI_y$ should be equal to a − 1. Furthermore, the value of c/a required to achieve this optimum is 2.

The proof of the foregoing statements can be illustrated graphically. Listing all of the possible sense gate control levels normalized to the cell supply current, $I_y$, the selected sense gate 7 encounters a control level $S_1$ where $S_1 = a + c$ if a "1" exists in that cell. If a "0" exists in the selected cell, it encounters a control level $S_0$, where $S_0 = \alpha a + c$. In FIG. 1, the right-most cell 2 otherwise designated therein as Unselected Cell encounters only circulating currents which, to differentiate them from $C_1$ and $C_0$ may be characterized as $U_1$ or $U_0$ where $U_1 = a$ if a "1" is stored and $U_0 = \alpha a$ if a "0" is stored. The Sense Discrimination Factor, F, is then defined as a $$F = \frac{S_1}{\max. [|S_0|, |U_0|, |U_1|]} \quad (1)$$

Substituting in Equation (1) the values for $S_1$, $S_0$, $U_1$ and $U_0$ and, assuming (without loss of generality) that a and c are positive and dividing each term by the value a, $$F = \frac{1 + \frac{c}{a}}{\max. [|\alpha + \frac{c}{a}|, 1, |\alpha|]} \quad (2)$$

Figure 2A:
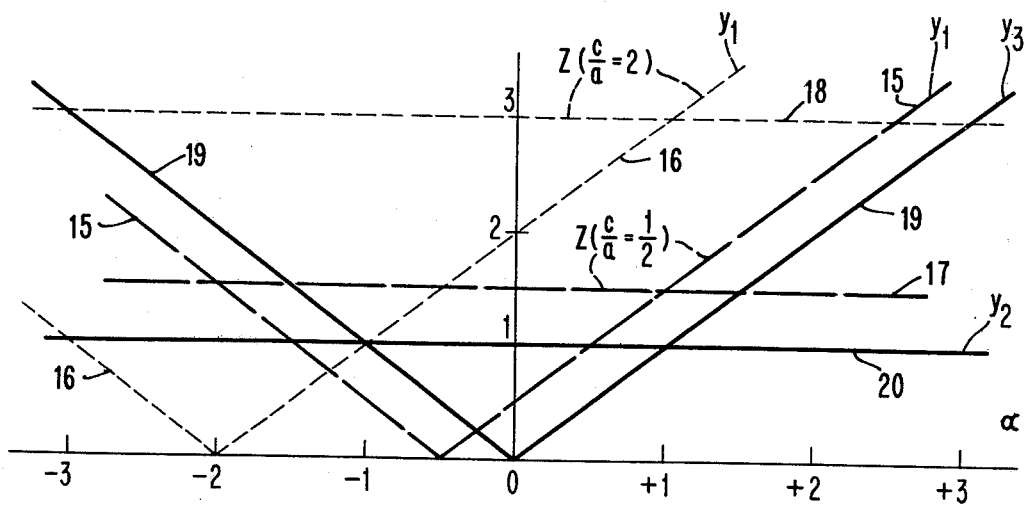
FIG. 2A is a plot of the functions $Y_1$, $Y_2$, $Y_3$ and Z upon which the general sense discrimination factor is dependent. These functions are plotted versus the dimensionless parameter $\alpha$ with the dimensionless parameter (c/a) as a parameter, where $\alpha$, c, and a are defined hereinafter.

If the terms of equation (2) are defined as $Y_1 \equiv |\alpha + (c/a)|$, $Y_2 \equiv 1$, $Y_3 \equiv |\alpha|$ and $Z \equiv 1 + (c/a)$, the maximum value of $F = Z/\max.[Y_1,Y_2,Y_3]$ can be obtained by plotting these terms as a function of $\alpha$ as shown in FIG. 2A.

Referring now to FIG. 2A, the functions $Y_1$, $Y_2$, $Y_3$ and Z are shown plotted versus $\alpha$, with c/a as a parameter. Only $Y_1$ and Z are dependent upon the parameter (c/a). In the plot of FIG. 2A, heavy dashed lines 15 and 17 correspond respectively to $Y_1$ and Z for (c/a) = ½ and dashed lines 16 and 18 correspond likewise for (c/a) = 2. In general, the function $Y_1$ shifts to the left and Z shifts upwardly as (c/a) is increased. The function $Y_3$ is plotted in FIG. 2A as solid lines 19. Finally, the function $Y_2$ is shown as solid line 20 in FIG. 2A. From FIG. 2A, one can readily discern, for a given value of c/a, the maximum of $Y_1$, $Y_2$, and $Y_3$ versus $\alpha$, and hence one can determine that value of $\alpha$ or range of $\alpha$ over which this maximum achieves its smallest value — such a choice for $\alpha$ results in the maximum F for this particular choice of c/a. For example, for c/a = ½, Z = 1.5 and max.($Y_1$,$Y_2$,$Y_3$)=$Y_2$=1 for $-1 \leq \alpha \leq +0.5$ and F = 1.5 — for any other choice of $\alpha$, in this case, max($Y_1$,$Y_2$,$Y_3$) > 1(=$Y_2$) and F < 1.5. Note that as c/a is increased and $Y_1$ shifts to the left, the smallest value of max.($Y_1$,$Y_2$,$Y_3$) remains 1=$Y_2$ until c/a > 2 in which cases $Y_1$ intersects $Y_3$ at a value larger than 1 (the corresponding $\alpha$ for such cases is < −1). Proceeding in this fashion, it can be readily seen that F is maximum with a value of 3 for c/a = 2 and $\alpha = -1$.

Figure 2B:
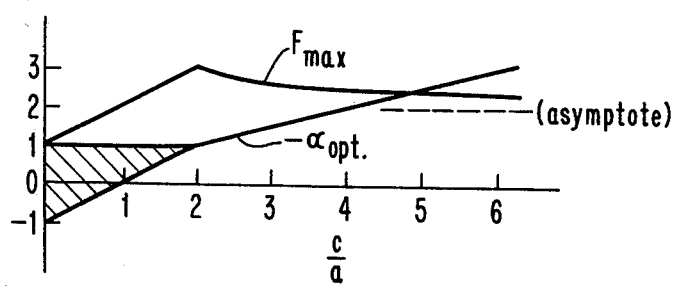
FIG. 2B is a plot of the maximum Sense Discrimination Factor, $F_{max}$, as a function of c/a. Also plotted in FIG. 2B is that value (or those values) of $\alpha$, ($\alpha$ opt.) which yields the maximum value of F.

Referring now to FIG. 2B, there is shown therein a plot of the maximum Sense Discrimination Factor, $F_{max}$, as a function of (c/a), as derivable from FIG. 2A. Also plotted therein is that value (or those values) of $\alpha$ ($\alpha$ opt), which yields the maximum value of F. It should be noted that for (c/a) < 2, there is no unique optimum value of $\alpha$ as indicated by the cross-hatched region in FIG. 2B.

From all the foregoing, it is recognized that to implement the maximum or best sense discrimination, a means for simultaneously achieving $\alpha = -1$ and (c/a) = 2 is required. The circulating current, a, is determined by the placement of the write gate and the relative inductances in the two branches of the memory loop, whereas c is determined by the current supplied during a read operation. Returning now to FIG. 1, array 1 can be considered for the more general case where the possible use of an extra control current, I*, is applied to sense gate 7 of Selected Cell 2 via control line 21 otherwise shown in FIG. 1 as a dashed line carrying current I*. As shown in FIG. 1, there is only one write gate 6 and one sense gate 7 associated with each of memory cells 2 and these gates are disposed in or adjacent to branches 4, 5, respectively of superconductive loop 3. Further, as indicated hereinabove, k is an inductance asymmetry parameter defined as $k \equiv L_s/(L_s+L_w)$ where $L_s(L_w)$ is the sense (write) branch self-inductance. With bipolar $I_y$ supplied by current source 8, the possible circulating currents are $\pm kI_y$. The control current supplied by control line 21 normalized to the cell-supply current, $I_y$, can be defined as $I^*/I_y = \beta$. During sensing, cell supply current, $I_y$, is applied and splits in general unequally between branches 4, 5 and has the values $kI_y$, $(1-k)I_y$, respectively, as shown in FIG. 1.

Assuming for purposes of exposition that $I_{min} = 0$ for write gate 6 of selected Cell 2 of FIG. 1, the possible sense gate control levels are as follows:

$$S_1 = C_1 + (1-k)I_y + I^* = (k+1-k+\beta)I_y = (\beta+1)I_y \quad (3)$$

$$S_0 = C_0 + (1-k)I_y + I^* = (-k+1-k+\beta)I_y = (\beta+1-2k)I_y \quad (4)$$

$$U_{1,0} = \pm kI_y \quad (5)$$

Figure 3:
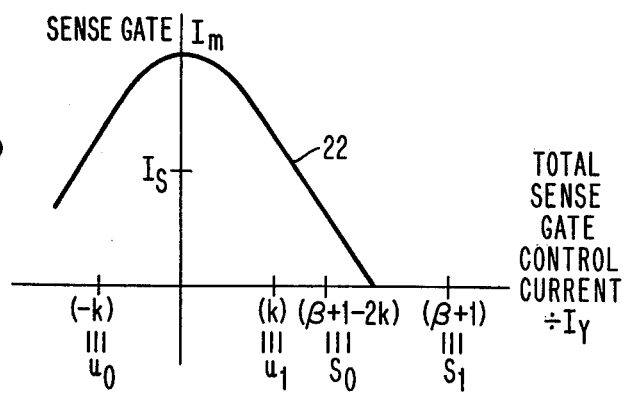
FIG. 3 is a plot of the maximum zero voltage sense gate current $I_m$ versus the total sense gate control current normalized to the cell gate current $I_y$. The resulting control currents on a sense gate are ultimately determined in terms of a factor $\beta$ and k wherein $\beta$ is the current through the dashed control line carrying current I* in FIG. 1 divided by the current applied to the memory cell $I_y$ and wherein $k = L_s/(L_s + L_w)$ where $L_s(L_w)$ is the sense (write) branch self-inductance.

In the above relationships, $S_1$ and $S_0$ are the sense gate control levels encountered by sense gate 7 when Selected Cell 2 is storing either a "1" or "0", respectively. $C_1$, $C_0$ are the circulating currents in Selected Cell 2 and have the values $kI_y$, $-kI_y$, respectively. $I^*$ has previously been defined as $\beta I_y$. $U_{1,0}$ are, of course, the possible clockwise and counterclockwise circulating currents, respectively, in Unselected Cell 2 of FIG. 1. Referring now to FIG. 3, there is shown a plot of sense gate threshold current, $I_m$, versus the total sense gate control current normalized to the cell gate current $I_y$. In FIG. 3, $I_S$ is the current applied to sense gate 7 via sense line 11 from current source 12. Gate current $I_S$ is disposed inside threshold characteristic 22 indicating that in the absence of the application of any control current, $I_S$ is insufficient to switch sense gate 7 to the voltage state. In FIG. 3, the relative positions of the control levels as determined from equations (3)–(5) above are shown on the control current axis of the sense gate threshold plot. At this point, it should be noted that for $\beta + 1 < 3k$, $S_0$ would be to the left of $U_1$. The actual relative positions depend upon the independent parameters k and $\beta$. In general, for a fixed $\beta$, as k is increased, $S_0$ moves to the left whereas $U_1$ moves to the right.

Figure 4:
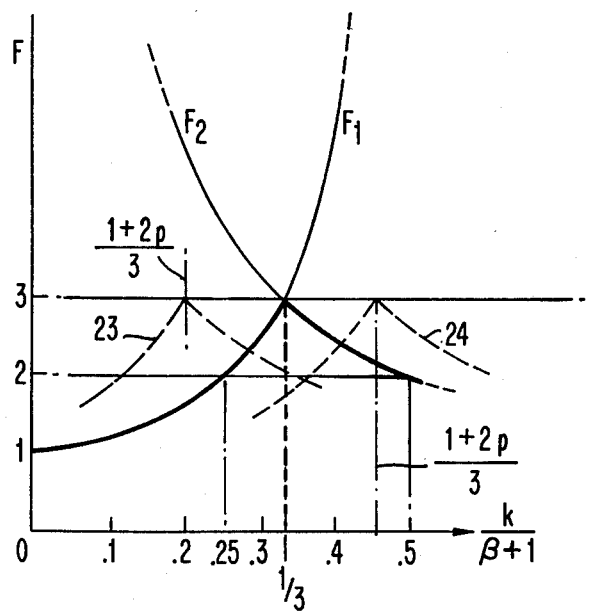
FIG. 4 is a graphical plot of discrimination factor F versus the function $k/(\beta + 1)$. Plots of $F_1 \equiv S_1/S_0$ and $F_2 \equiv S_1/U_1$ as functions of $k/(\beta + 1)$ are shown. $S_1$ is the possible sense gate control level when a selected cell is storing a binary 1 and, $S_0$ is the possible sense gate control level when a selected cell is storing a binary 0. $U_1$ is the possible sense gate current control level when an unselected cell is storing a binary 1. Also plotted, as a heavy line, is the actual discrimination factor $F = $ min. $(F_1, F_2)$.

Referring now to FIG. 4, there is shown therein a graph of Sense Discrimination Factor, F, versus the parameter $k/(\beta+1)$. Plots of $F_1 = S_1/S_0$ and $F_2 = S_1/U_1$ as functions of $k/(\beta+1)$ are also shown. $S_1$ is the possible sense gate control level when a Selected Cell is storing a binary 1 and $S_0$ is the possible sense gate control levels when a Selected Cell is storing a binary "0." $U_1$ is the possible sense gate current control level when an Unselected Cell is storing a binary 1. Also plotted, as a heavy line, is the actual Discrimination Factor, F = min.(F1,F2). The maximum value of F is 3, corresponding to the theoretical maximum limit, when F1 = F2, i.e., when $U_1 = S_0$ in FIG. 3. From FIG. 4 then, the maximum or optimum value of $k/(\beta+1)$ is $\frac{1}{3}$. For this value of $k/(\beta+1)$, substituting it into the relationship $F = S_1/U_1$, one obtains $F = (\beta+1)/[(\beta+1)/3] = 3$. This value of F is independent of $\beta$, that is to say, there is no advantage whatever in employing an extra sense control such as control line 21 in FIG. 1. Hence, $\beta$ may be assumed to be equal to zero and extra control lines such as control line 21 in FIG. 1 can be eliminated for sense gate 7. Under such circumstances, the optimum k is $k_{opt} = \frac{1}{3}$ which when related to the asymmetry factor $k = L_s/(L_s+L_w)$ corresponds to $L_w = 2L_s$ for $I_{min} = 0$ as assumed at the beginning of this discussion.

In general, $I_{min} \neq 0$. The above analysis can readily be extended to the finite $I_{min}$ case, in which event the optimum value of $k/(\beta+1)$ is, $$\left(\frac{k}{\beta+1}\right)_{opt.} = \frac{1+2p}{3} \quad (6)$$

with $$p = \frac{1}{(\beta+1)} \frac{I_{min}}{I_Y}.$$

This value for $k/(\beta+1)$ again yields $F_{max} = 3$, independent of p.

From the foregoing, it should be appreciated that where the value of $I_{min}$ is other than zero, a value of k can be obtained which will always provide a maximum value of 3 by choosing the inductance relationship or inductance asymmetry properly. To the extent that other values of k could be utilized which provide Sense Discrimination Factors, F, less than the maximum value of 3, one need only select an appropriate value of k in FIG. 4 and then determine the relationship for the write branch inductance and the sense branch inductance of the superconductive loop. The heavy lined portion of FIG. 4, as indicated hereinabove, applies to the situation where $I_{min} = 0$. Thus, values of k in excess of 0.25 and less than 0.5 could provide Sense Discrimination Factors, F, anywhere in the range $2 < F \leq 3$.

For cases where $I_{min}$ does not equal zero ($p \neq 0$), a family of curves similar to the heavy line portion of FIG. 4 and shown for example as a pair of dashed curves 23, 24 therein would be obtained. Obviously, while the maximum value of F obtainable is always 3, this maximum will occur at different values of k as determined by equation (6) above. Likewise, those values of k which yield F in excess of 2 also depend upon p. In general $2 < F \leq 3$ for $(1+3p)/4 < (k/\beta+1) < (1+p)/2$.

As indicated at the outset of the above analysis, the criteria for obtaining the maximum Sense Discrimination Factor, F = 3, must be adhered to. Thus, there must be equal clockwise and counterclockwise circulating currents; the write gate and the sense gate must be associated with different branches of the memory cell superconductive loop and the inductances of the branches must, in general, be asymmetric. For a situation where the $I_{min}$ of the write gate equals zero, the inductance of the branch which contains the write gate must be two times the inductance of the branch associated with the sense gate. For all other situations, where $I_{min}$ of the write gate is not equal to zero, equation (6) above can be invoked to determine the value of k and, in turn, the values of inductance which will provide a Sense Discrimination Factor, F = 3. It follows from a consideration of all of the above that unequal magnitude circulating currents, as can obtained via multiple write gates in asymmetric cells, do not allow the maximum possible sense discrimination. A special case of this general type is that binary mode consisting of a "1" defined as the presence of a current and a "0" defined as the absence of any current. In this instance, the maximum possible value of F is only 2. Also, placement of a single write gate in the same branch which passes over the sense gate does not permit c/a = 2. Where the write gate is in the same branch which passes over the sense gate, c/a = 1 and from equation (2) or FIG. 2B above the maximum possible F in this instance is again only 2.

The memory array 1 of FIG. 1 has been utilized to show how improved sense discrimination can be obtained in single write gate memory cells 2.

Figure 5:
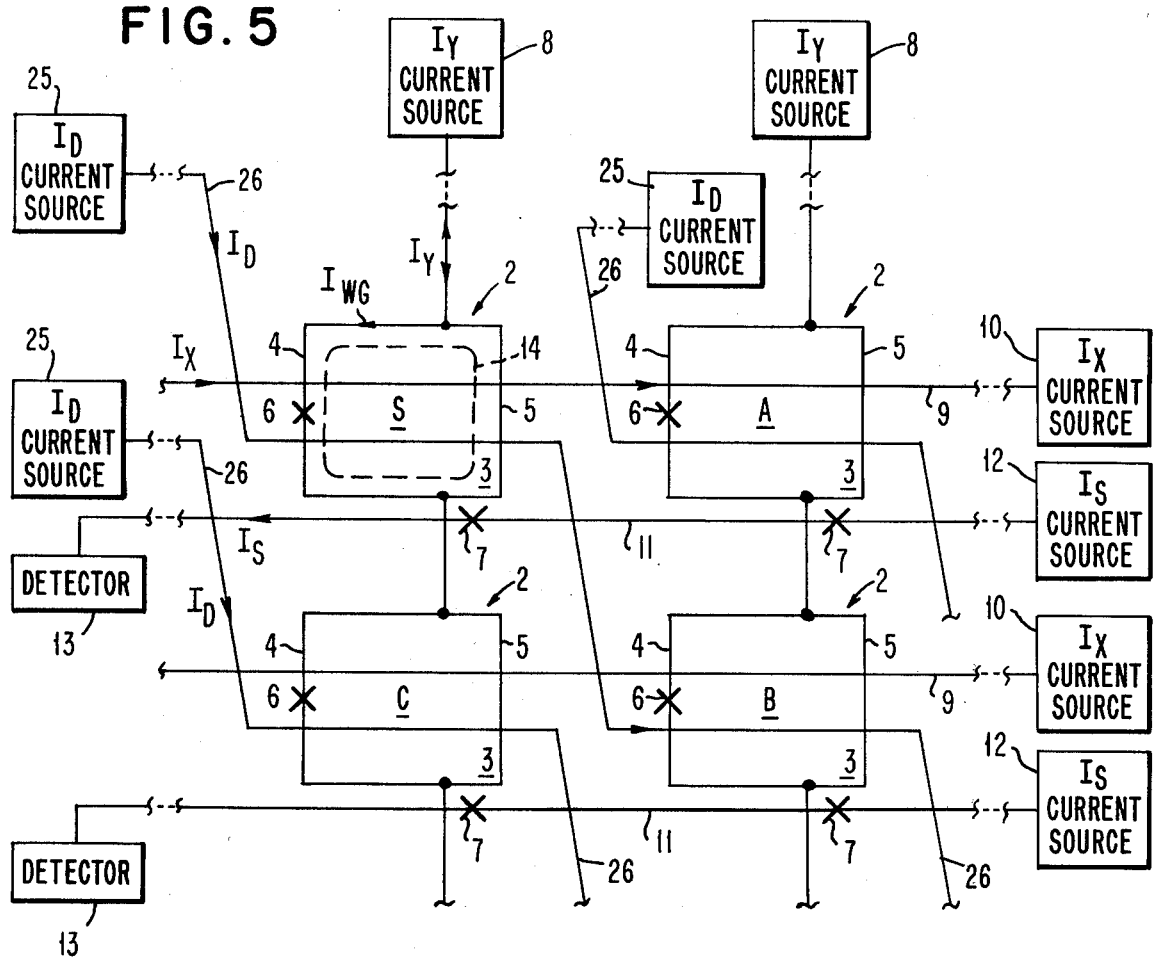
FIG. 5 is a schematic diagram of a portion of an array of memory cells each of which incorporates a single write gate and a single sense gate. There are two write gate controls, one of which runs diagonally and the other of which runs horizontally. The binary states are represented by a pair of counterrotating circulating currents which are equal in magnitude and proportional to a supply current, $I_y$.

In general terms, to achieve the best write margins possible, the cells should be wired so that the write gates of Unselected Cells are subjected to no more than one unit of control or supply current whereas the write gate of the Selected Cell encounters both the supply current as well as all control currents utilized. In the usual situation where coincident selection is employed, vertical and horizontal selection currents are used so that a write gate of a selected cell encounters both vertical and horizontal selection currents. All write gates of Unselected Cells encounter only one vertical or one horizontal current or no current. The addition of new vertical or horizontal currents does not change the picture significantly merely adding an increment of current to those already present. A consideration of FIG. 5 clearly shows that an additional control current can be added which, while adding to the control currents available to a Selected Cell write gate, only adds a control current to an Unselected Cell write gate which previously encountered no control currents at all. Now, the ratio of control currents in a Selected Cell to those in an Unselected Cell is 3/1 in a case where diagonal control lines are used. Where only two lines are used, the effective ratio is 2/1 and where an additional horizontal or vertical control line is used, the effective ratio is 3/2. In the general case, for an NxN array, in principle up to N-1 unique sets of diagonal write gate control lines are possible. For an array having one set of horizontal controls and n independent sets of diagonal controls, a Selected Cell is subjected to n+2 units of current whereas an Unselected Cell is subjected to at most 1 unit of current. In short, the greater the number of diagonal controls, the greater is the discrimination between write gates in Selected and Unselected cells. However, increasing the discrimination in this fashion must be accompanied by a decreased bit density (more space required for writing) and an increased complexity of wiring. Accordingly, a trade-off exists between the number of write gate controls and the write operating margins. This trade-off is best exemplified by the arrangement of FIG. 5 which shows a schematic diagram of an array of memory cells each of which incorporates a single write gate having two write gate controls, one of which runs diagonally and the other of which runs horizontally, and a sense gate. The memory cell is similar in every way to the arrangement of FIG. 1 except that it includes an additional diagonal control line passing over each of the memory cells. The same reference characters which identify the same elements in FIG. 1 have been utilized in FIG. 5. Thus, write gate 6 is associated with branch 4; sense gate 7 is associated with branch 5; the inductances are asymmetrical and the circulating currents 14 are equal clockwise and counterclockwise rotating currents. The read cycle of the array of FIG. 5 is identical with the read cycle described in connection with the operation of FIG. 1. In writing a selected cell, for example the cell designated S in FIG. 5, current sources 8 and 10 associated with the column and row of Selected Cell S along with current source 25 otherwise identified in FIG. 5 as $I_D$ Current Source are energized simultaneously. Source 25 is connected to control line 26 which intersects write gate 6 of Selected Cell S. The summed control currents $I_D$, $I_X$ along with cell current $I_Y$ cause write gate 6 of selected cell S to switch to the voltage state thereby inducing a circulating current in superconductive loop 3 in either a clockwise or counterclockwise direction depending on the polarity of cell current $I_Y$ and indicated by dashed line 14 in Selected Cell S.

Figure 6:
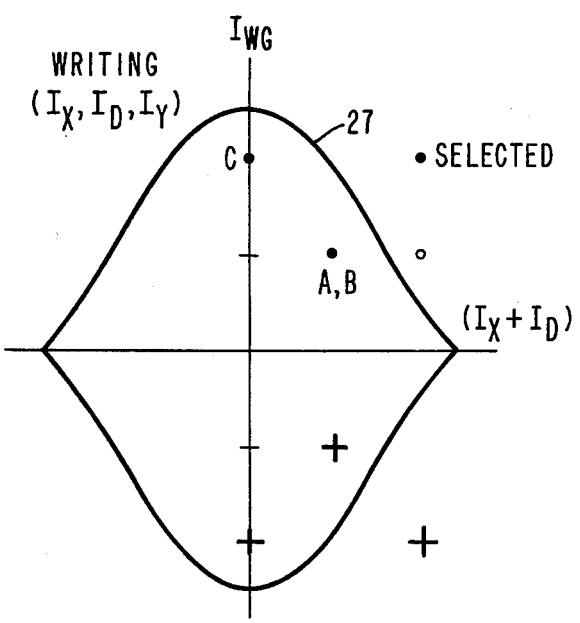
FIG. 6 shows a typical write gate switching threshold curve wherein the static operating points for a typical write cycle are shown as solid circles. The short horizontal segments on the vertical axis indicate the two possible circulating current states prior to writing, for a standard cycle. The open circle indicates the selected cell operating point during its very first write cycle.

During the write operation, Selected Cell S in FIG. 5 is subjected to the currents $I_Y$, $I_X$ and $I_D$ simultaneously whereas Unselected Cells A, B, and C are subjected only to one of the currents $I_X$, $I_D$, and $I_Y$. A typical write gate switching threshold curve 27 is shown in FIG. 6 where $I_{WG}$ is the total current through the write gate branch as indicated in cell S of FIG. 5. The closest possible static operating points for a typical write cycle are shown as solid circles. The short horizontal segments on the vertical axis indicate the two possible circulating current states prior to writing for a standard cycle. The open circle indicates the unselected cell operating point during its very first write cycle. It should be noted that the required magnitudes of $I_X$, $I_D$ and $I_Y$ are the same for the first cycle as for all successive cycles indicating that no special set-up cycle is required. This result is due to the fact that cell A of FIG. 5, for example, is subjected to only approximately one half the control current that is applied to the Selected Cell S. An additional observation is that two write gate controls rather than one permits the individual control current to be one half the value required for a single control write gate. From FIG. 6, it can be seen that the simultaneous application of $I_X$, $I_D$ and $I_Y$ switch Selected Cell S as indicated by solid circle S disposed outside of threshold curve 27. The write gates 6 of memory cells A, B of FIG. 5 experience $I_X$ and $I_D$, respectively. These currents in conjunction with the circulating currents present in the cells provide an operating point shown by a solid circle in FIG. 6 and otherwise designated therein as A, B. Operating point A, B is disposed within threshold 27 and accordingly, the write gate 6 of Unselected Cells A, B remain in the zero voltage state. The write gate 6 of Unselected Cell C experiences a supply current contribution $kI_Y$ and a circulating current and accordingly remains unswitched having an operating point within threshold curve 27 otherwise designated in FIG. 6 as C.

Figure 7:
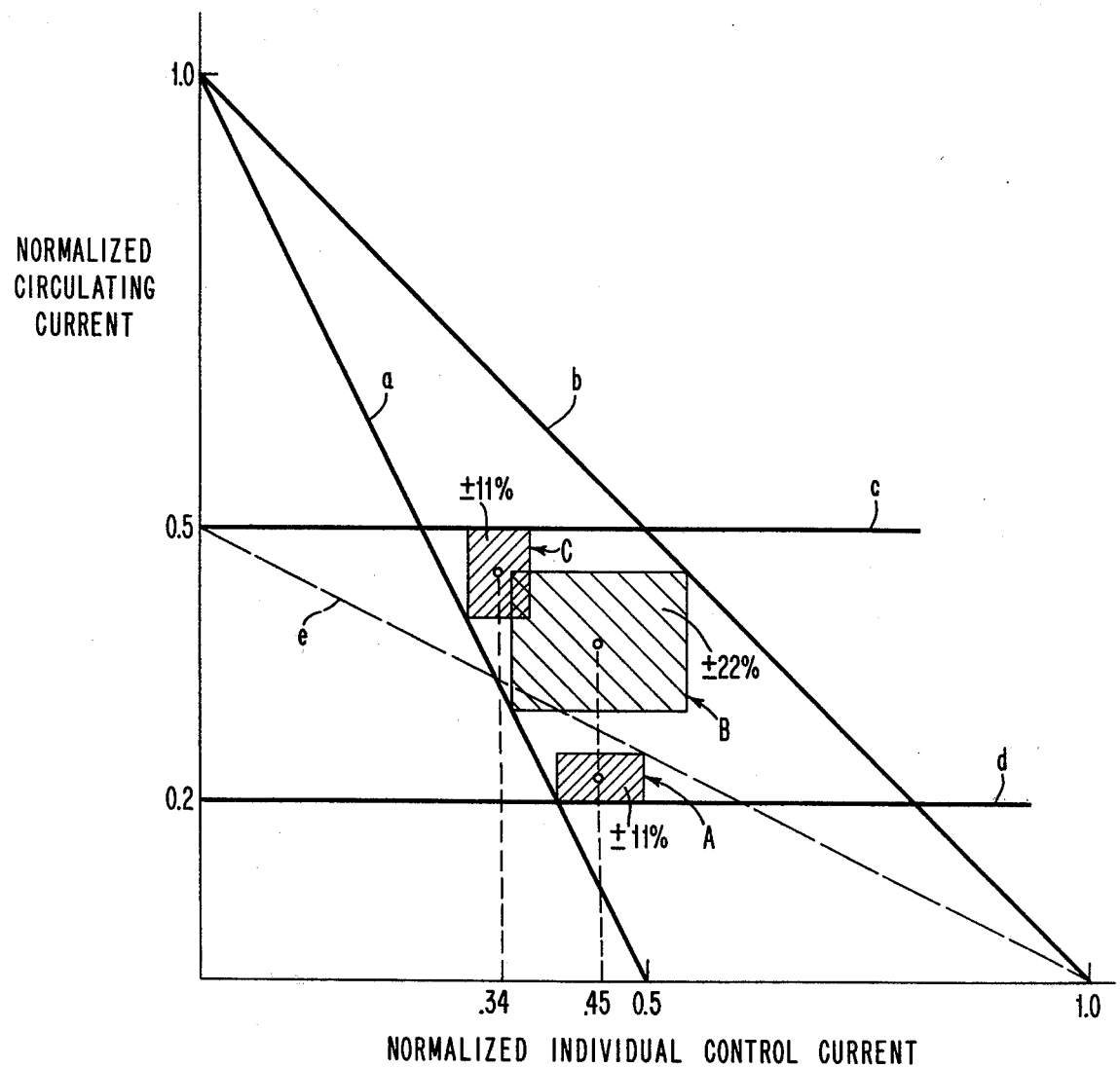
FIG. 7 is a graph of the normalized circulating current versus the normalized individual control currents applied to a memory cell.

In general, the further away the operating points are from threshold curve 27 of FIG. 6, the greater the allowed variation of the threshold curves across array 1 of FIG. 5. For $I_X = I_D$, the foregoing statement can be directly translated into an intrinsic static operating region plot in the $I_Y$-$I_X$ plane similar to that shown in FIG. 7. FIG. 7 is a graph of the normalized circulating current versus the normalized individual control currents applied to a memory cell. The term intrinsic operating region means the set of all possible $I_Y$, $I_X$ coordinates allowed in the special case in which there are no fabrication variations across an array. For purposes of exposition, in FIG. 7, the write gate threshold curve is taken to be a straight line and it is assumed that the currents $I_X$, $I_D$ and $I_Y$ are approximately equal. A maximum side lobe amplitude of 0.2 $I_{mo}$ is also assumed where $I_{mo}$ is the zero field critical current of a write gate 6. The solid lines (a), (b), (c) and (d) bound the operating region of the array configuration of FIG. 5. If the second control line 26 of FIG. 5 which carries current $I_D$ were to run vertically instead of diagonally, line (c) would be replaced by the dashed line (e). (In FIG. 6, point C would be shifted to the right.) The maximum operating region for the last mentioned case is approximately ±11% (cross hatched region A in FIG. 7) whereas for the same control current, the operating region in the diagonal line case is approximately ±22% (the cross hatched region C in FIG. 7), i.e., twice as large. In both instances, the control current level can be reduced at the expense of the operating region. For example, in the diagonal case, the operating region reduces to ±11% (cross hatched region C in FIG. 7) for a reduction of normalized control current from 0.45 to 0.34; i.e., a reduction of approximately 24%.

The use of diagonal control lines in Josephson technology memory arrays gives the following advantages:

The benefits of reduced control current levels and the feasibility of a no set-up mode of operation where multiple controls are used; and, A maximized write operating region for simple memory cells.

The foregoing advantages coupled with the ability to achieve the maximum Sense Discrimination Factor, F, using the criteria described hereinabove, permit the use of memory cells in array form which have both sense and write margins significantly improved over the prior art.

In discussing the memory arrays of FIG. 1 and FIG. 5, no mention has been made of the use of decoders to energize the appropriate current sources to select an appropriate gate. Since such decoding forms no part of the present invention and can be accomplished in a manner well-known to those skilled in the memory arts, it need not be elaborated herein.

To the extent that the embodiments described hereinabove include Josephson junction devices which must be operated in a cryogenic environment, the various interconnections and control lines all may be made of superconducting materials such as niobium or lead alloys. Typical Josephson junctions and interconnection circuitry which may be utilized in the practice of the present invention are shown in U.S. Pat. No. 3,758,795, Ser. No. 267,841, filed June 30, 1972 and assigned to the same assignee as the present invention. A typical fabrication technique for forming Josephson junction devices is shown in U.S. Pat. No. 3,849,276, Ser. No. 125,993, filed Mar. 19, 1971, and assigned to the same assignee as the present invention. U.S. Pat. No. 3,626,391 Ser. No. 744,949, filed July 15, 1968 and assigned to the same assignee as the present invention shows a Josephson tunneling memory array. The arrays of the present application can be fabricated in a manner similar to that described in that patent.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A memory cell array for storing binary information each cell comprising:
a superconductive loop which stores binary information in the form of equal magnitude clockwise and counterclockwise circulating currents in said loop, said loop containing first and second branches said branches having different values of inductance,
a first switchable device which carries Josephson current having a given minimum value of current at which said first device resets disposed in said first branch,
means connected to said loop for applying a given cell current, and,
a second switchable device which carries Josephson current disposed in electromagnetically coupled relationship with said second branch.

2. A memory cell array according to claim 1 wherein said first and second switchable devices are interferometers.

3. A memory cell array according to claim 1 wherein the value of inductance of said first branch is two times the value of inductance of said second branch and said given minimum value of current is zero.

4. A memory cell array according to claim 1 wherein said first switchable device has a given minimum value of current other than zero.

5. A memory cell array according to claim 1 wherein said first switchable device has a given minimum value of current greater than zero.

6. A memory cell array according to claim 1 further including means connected to said cell for applying a write current to said first device to write binary information into said cell.

7. A memory cell array according to claim 6 wherein said means for applying said given cell current includes a current source connected to said memory cell, and said means for applying a write current includes at least a source of write current and at least a control line connected to said write current source disposed in electromagnetically coupled relationship with said first switchable device.

8. A memory cell array according to claim 7 wherein said current source is a source of bipolar pulses.

9. A memory cell array according to claim 1 further including means connected to said cell for applying a sense current to said cell to sense binary information stored in said cell.

10. A memory cell array according to claim 9 wherein said means for applying said given cell current includes a current source connected to said memory cell, and said means for applying a sense current includes a sense line connected to said second switchable device and a source of sense current connected to said sense line.

11. A memory cell array according to claim 10 wherein said current source of sense current is a source of unipolar pulses.

12. An array of memory cells for storing binary information each of said memory cells comprising:
a superconductive loop which stores binary information in the form of equal magnitude clockwise and counterclockwise circulating currents in said loop, said loop containing first and second branches said branches having different values of inductance in accordance with the ratio $[L_s/(L_s+L_w)] = [1+2(I_{min}/I_y)] \div 3$ where $L_s$ is the inductance of said second branch and $L_w$ is the inductance of said first branch,
a first switchable device which carries Josephson current having a given minimum value of current at which said first device resets, $I_{min}$, disposed in said first branch,
a second switchable device which carries Josephson current disposed in electromagnetically coupled relationship with said second branch, means connected to said loop for supplying a given cell current, $I_p$, and a sense line connected to said second switchable device.

13. A memory array according to claim 12 further including means connected to each of said cells for applying a write current to said first device thereof to write binary information into a selected one of said memory cells.

14. A memory array according to claim 12 further including means connected to said sense line for applying sense current thereto to sense binary information from a selected one of said memory cells.

15. A memory array according to claim 12 wherein said ratio is ½ and said given minimum value of current is zero.

16. A memory array according to claim 12 wherein said given minimum value of current is zero.

17. A memory array according to claim 12 wherein said given minimum value of current is other than zero.

18. A memory array according to claim 12 wherein said given minimum value of current is greater than zero.

19. A memory array according to claim 12 wherein each of said cells utilizes a horizontally disposed control line and a diagonally disposed control line to write binary information into a selected cell.

20. A memory according to claim 12 further including a control line disposed in electromagnetically coupled relationship with said second switchable device.

* * * * *